(12) United States Patent
De Wit et al.

(10) Patent No.: US 12,140,873 B2
(45) Date of Patent: Nov. 12, 2024

(54) POSITIONING DEVICE

(71) Applicant: ASML NETHERLANDS B.V., Veldhoven (NL)

(72) Inventors: Paul Corné Henri De Wit, Eindhoven (NL); Ringo Petrus Cornelis Van Dorst, Boxtel (NL)

(73) Assignee: ASML NETHERLANDS B.V., Veldhoven (NL)

( * ) Notice: Subject to any disclaimer, the term of this patent is extended or adjusted under 35 U.S.C. 154(b) by 178 days.

(21) Appl. No.: 17/793,525

(22) PCT Filed: Jan. 14, 2021

(86) PCT No.: PCT/EP2021/050711
§ 371 (c)(1),
(2) Date: Jul. 18, 2022

(87) PCT Pub. No.: WO2021/151682
PCT Pub. Date: Aug. 5, 2021

(65) Prior Publication Data
US 2023/0121341 A1 Apr. 20, 2023

(30) Foreign Application Priority Data
Jan. 28, 2020 (EP) .................................... 20154103

(51) Int. Cl.
*G03F 7/00* (2006.01)
(52) U.S. Cl.
CPC ...... *G03F 7/70775* (2013.01); *G03F 7/70716* (2013.01)

(58) Field of Classification Search
CPC ............. G03F 7/70775; G03F 7/70716; G03F 7/70516; G03F 7/70733
See application file for complete search history.

(56) References Cited

U.S. PATENT DOCUMENTS

| | | |
|---|---|---|
| 6,020,964 A | 2/2000 | Loopstra et al. |
| 6,952,253 B2 | 10/2005 | Lof et al. |

(Continued)

FOREIGN PATENT DOCUMENTS

WO  2014063995  5/2014

OTHER PUBLICATIONS

International Search Report and Written Opinion issued in corresponding PCT Patent Application No. PCT/EP2021/050711, dated Mar. 26, 2021.

*Primary Examiner* — Hung V Nguyen
(74) *Attorney, Agent, or Firm* — Pillsbury Winthrop Shaw Pittman, LLP (57) ABSTRACT

A positioning device, including: a first positioning module arranged to support and position a first substrate, a second positioning module arranged to support and position a second substrate, a first positioning field in which the first and second positioning modules can be alternatingly positioned to carry out a first processing sequence, a second positioning field in which the first and second positioning modules can be alternatingly positioned to carry out a second processing sequence, wherein when one of the first and second positioning modules is carrying out or finishing the first processing sequence, the other of the first and second positioning modules has finished the second processing sequence and is positioned closer to the one of the first and second positioning modules.

20 Claims, 7 Drawing Sheets

(56) References Cited

U.S. PATENT DOCUMENTS

| | | | | |
|---|---|---|---|---|
| 8,711,327 | B2 * | 4/2014 | Shibazaki | G03F 7/70733 |
| | | | | 355/72 |
| 9,885,963 | B2 * | 2/2018 | Matsumoto | G03F 7/70725 |
| 2007/0058173 | A1 | 3/2007 | Holzapfel | |
| 2007/0263197 | A1 * | 11/2007 | Luttikhuis | G03B 27/53 |
| | | | | 355/53 |
| 2009/0153822 | A1 | 6/2009 | Shibazaki | |
| 2014/0132940 | A1 | 5/2014 | Yoda | |
| 2022/0277962 | A1 * | 9/2022 | Kodama | H01L 21/6708 |

* cited by examiner

POSITIONING DEVICE

CROSS-REFERENCE TO RELATED APPLICATIONS

This application is the U.S. national phase entry of PCT/EP2021/050711 which was filed Jan. 14, 2021, which claims the benefit of priority of European Patent Application No. 20154103.4 which was filed on Jan. 28, 2020, and which is incorporated herein in its entirety by reference.

FIELD

The present invention relates to a positioning device and a method to use a positioning device.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

In a known embodiment of a lithographic apparatus, the lithographic apparatus comprises a first positioning module to support and position a first substrate and a second positioning module to support and position a second substrate. This type of lithographic apparatus is often indicated as dual-stage lithographic apparatus.

The advantage of such dual-stage lithographic apparatus is that, simultaneously, the first positioning module may be arranged in a first positioning field to cooperate with one or more first processing devices and the second positioning module may be arranged in a second positioning field to cooperate with one or more second processing devices. For example, the first positioning field is an exposure field, where the first substrate is exposed to a patterned radiation beam, and the second positioning field is a measurement field, where the upper surface of the second substrate is measured by a level sensor.

In this lithographic apparatus, each substrate to be processed will first be arranged in the measurement field and thereafter in the exposure field. In the measurement field and the exposure field, the substrate will be supported by the same positioning module. When the processing of the substrates supported on the first positioning module and the second positioning module is finished, the first positioning module and the second positioning module may swap positions, for example the second positioning module is moved to the first positioning field and the first positioning module is moved to the second positioning field.

The simultaneous processing of two substrates on two positioning modules arranged alternately in the first positioning field and the second positioning field provides a substantial improvement in time efficient use of the projecting system of the lithographic apparatus.

Nevertheless, there is a general need to use the lithographic apparatus as efficiently as possible.

SUMMARY

It is an object of the invention to provide a positioning device, for example a positioning device of a lithographic apparatus, with improved efficiency of the use of the two positioning modules of the positioning device.

According to an aspect of the invention, there is provided a positioning device, comprising: a first positioning module arranged to support and position a first substrate, a second positioning module arranged to support and position a second substrate, a first positioning field in which the two positioning modules can be alternatingly positioned to carry out a first processing sequence, a second positioning field in which the two positioning modules can be alternatingly positioned to carry out a second processing sequence, wherein when one of the two positioning modules is carrying out or finishing the first processing sequence, the other positioning module has finished the second processing sequence and is positioned (alternatively: positioning) closer to the one of the two positioning modules. Alternatively or additionally, wherein when one of the two positioning modules is carrying out or finishing a final step of the first processing sequence, the other positioning module has finished the second processing sequence and is positioned (alternatively: positioning) closer to the one of the two positioning modules According to an aspect of the invention, there is provided a method of using a positioning device, the positioning device, comprising: a first positioning module arranged to support and position a first substrate, a second positioning module arranged to support and position a second substrate, a first positioning field in which the two positioning modules can be alternatingly positioned to carry out a first processing sequence, a second positioning field in which the two positioning modules can be alternatingly positioned to carry out a second processing sequence, wherein when one of the two positioning modules is carrying out or finishing the first processing sequence, the other positioning module has finished the second processing sequence and is positioned (alternatively: positioning) closer to the one of the two positioning modules. Alternatively or additionally, wherein when one of the two positioning modules is carrying out or finishing a final step of the first processing sequence, the other positioning module has finished the second processing sequence and is positioned (alternatively: positioning) closer to the one of the two positioning modules

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultraviolet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
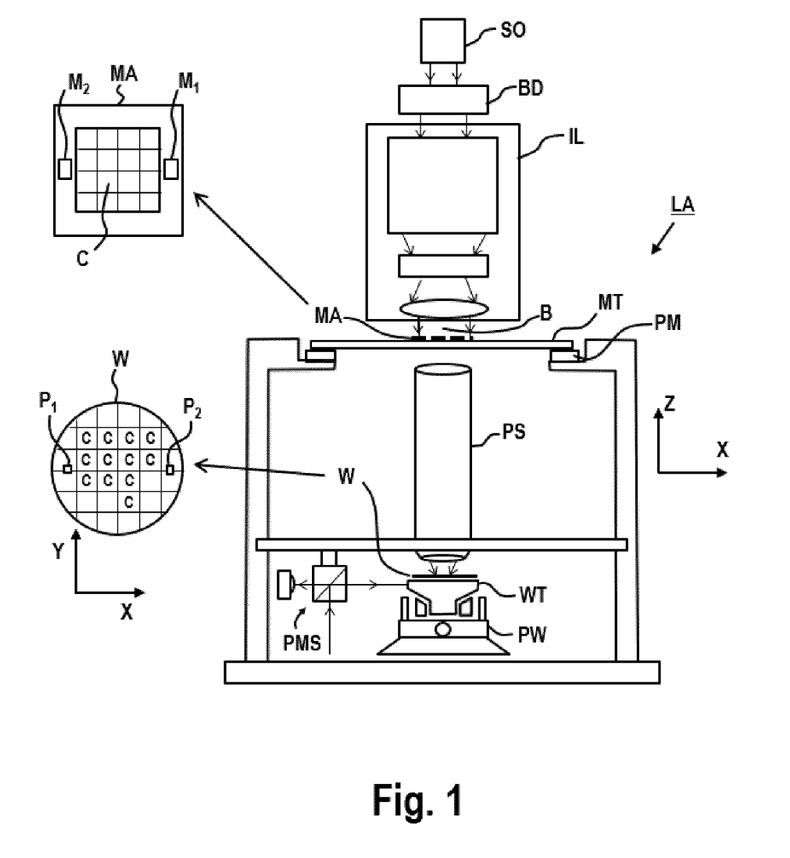
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
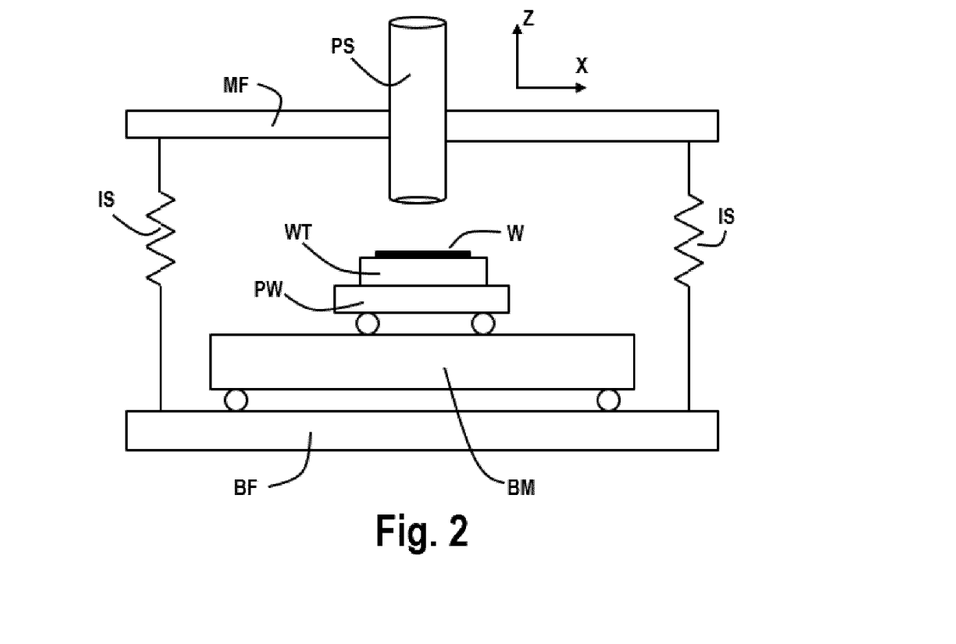
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
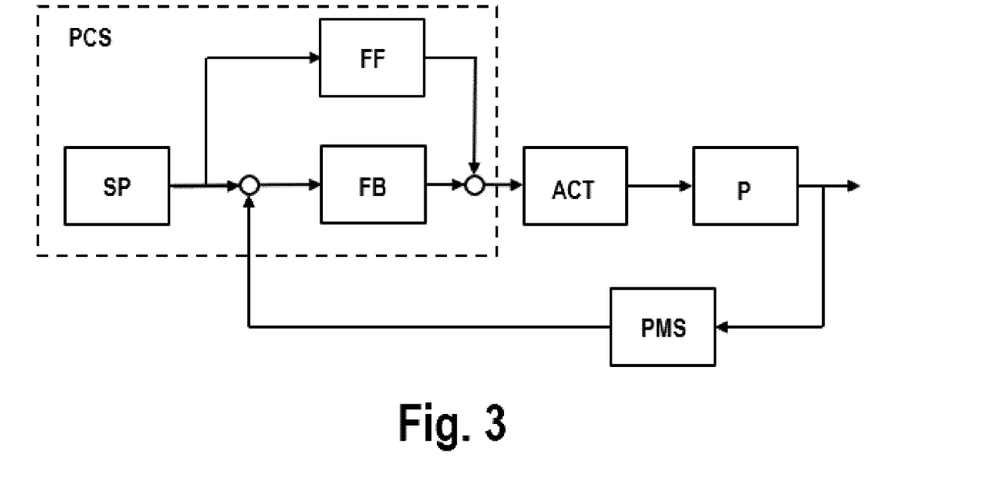
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
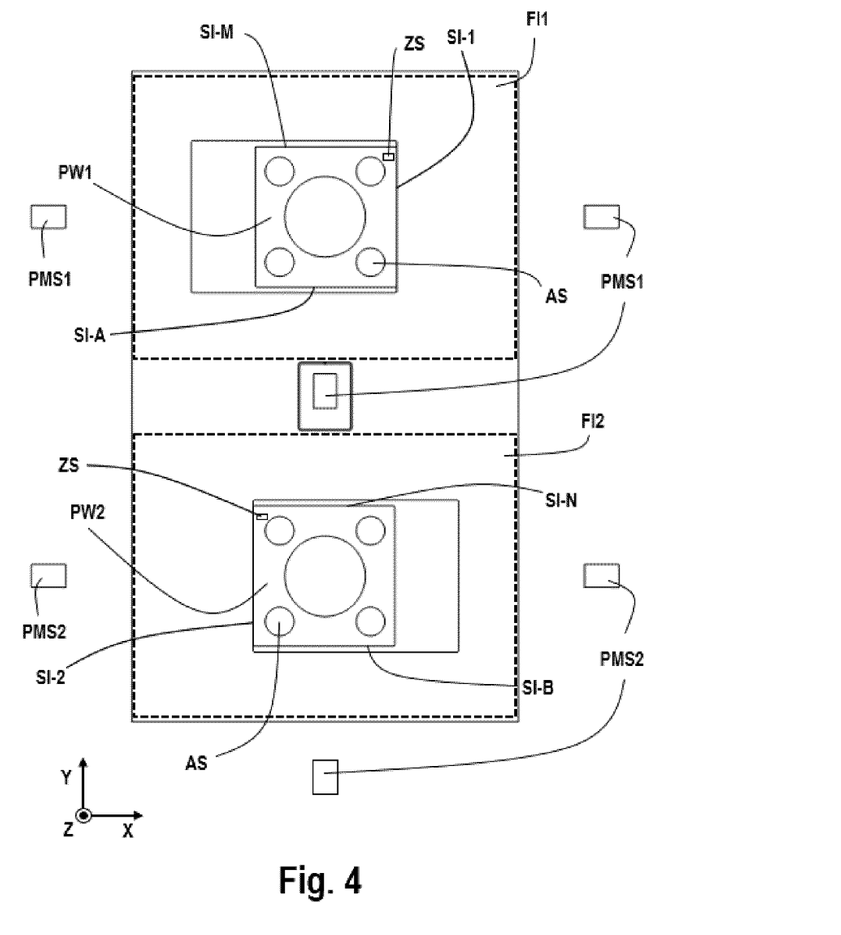
FIGS. 4 to 8 depict top views on the positioning modules of a positioning device of a lithographic apparatus with different positions of the first positioning module and the second positioning module.

FIG. 4 shows a top view on a first positioning module PW1 and a second positioning module PW2 of a lithographic apparatus.

The first positioning module PW1 and the second positioning module PW2 are each arranged to support a substrate. The first positioning module PW1 and the second positioning module PW2 can be moved in a first positioning field FI1 and a second positioning field FI2. The first positioning field FI1 and the second positioning field FI2 extend in a positioning plane extending in y-direction and x-direction. In the first positioning field FI1, the first positioning module PW1 or the second positioning module PW2 may cooperate with one or more first processing devices to process the substrate supported by the first positioning module PW1 or the second positioning module PW2, respectively. This processing can relate to a first processing sequence. In the first positioning field FI1 the two positioning modules can be alternatingly positioned to carry out a first processing sequence. That is, the first positioning module PW1 can be positioned to carry out the first processing sequence, then the second positioning module PW2 can be positioned to carry out the first processing sequence, then the first positioning module PW1 can be positioned to carry out the first processing sequence, etc.

In the second positioning field FI2, the first positioning module PW1 or the second positioning module PW2 may cooperate with one or more second processing devices to process the substrate supported by the first positioning module PW1 or the second positioning module PW2, respectively. This processing can relate to a second processing sequence. In the second positioning field FI2 the two positioning modules can be alternatingly positioned to carry out a first processing sequence. That is, the second positioning module PW2 can be positioned to carry out the second processing sequence, then the first positioning module PW1 can be positioned to carry out the second processing sequence, then the second positioning module PW2 can be positioned to carry out the second processing sequence, etc.

The first positioning field FI1 and the second positioning field FI2 are arranged adjacent to each other in the y-direction. The first positioning field is for example an expose field, whereby the one or more processing devices comprise a projection system arranged to project a patterned radiation beam on the substrate. The one or more processing devices may further comprises processing devices to cooperate with a zeroing location ZS and an aberration control measurement sensor AS mounted on each of the first positioning module PW1 and the second positioning module PW2.

The second positioning field FI2 is for example a measure field, in which the upper surface of a substrate may be measured by a level sensor to determine a height map of this upper surface of the substrate. This height map may be used during projection of the patterned radiation beam in the expose field to improve the positioning of the upper surface of the substrate W with respect to the incident patterned radiation beam. Further, in the second positioning field FI2, a substrate may be loaded on and unloaded from the first positioning module PW1 or the second positioning module PW2.

A first position measurement system PMS1 is arranged to measure a position of the first positioning module PW1 or second positioning module PW2, when positioned in the first positioning field FI1. A second position measurement system PMS2 is arranged to measure a position of the first positioning module PW1 or second positioning module PW2, when positioned in the second positioning field FI2. The first position measurement system PMS1 and the second position measurement system PMS2 are for example interferometer systems. The first positioning module PW1 and the second positioning module PW2 can be swapped in position in the y-direction such that the first positioning module PW1 and the second positioning module PW2 can alternately be used in the first positioning field FI1 and the second positioning field FI2. Since the first positioning module PW1 and the second positioning module PW2 are connected by cables to a stationary part of the lithographic apparatus, the first positioning module PW1 and the second positioning module PW2 can pass each other only in one way where the first positioning module PW1 is arranged in FIG. 4 left from the second positioning module PW2 (see also FIG. 6). During the position swap a first side SI-1 of the first positioning module PW1 will be facing a second side SI-2 of the second positioning module PW2. Since the first positioning module PW1 and the second positioning module PW2 will always pass each other at the same side, also the first side SI-1 and the second side SI-2 will be facing each other in x-direction.

In FIG. 4, the first positioning module PW1 is arranged in the first positioning field FI1 and the second positioning module PW2 is arranged in the second positioning field FI2.

These positions are typically used during simultaneous processing of two substrates in the lithographic apparatus. One substrate supported by the first positioning module PW1 in the first positioning field FI1 may for example be exposed to a patterned beam of radiation, while a substrate supported by the second positioning module PW2 is processed in the second positioning field FI2. For example, in the second positioning field FI2 an exposed substrate may be unloaded from the second positioning module PW2, a new substrate may be loaded on the second positioning module PW2 and an upper surface of the substrate of the second positioning module PW2 may be measured by a measuring device. e.g. a level sensor.

When the processing of the two substrates in the respective positioning field FI1, FI2 is finished, the second positioning module PW2 is moved to the first positioning field FI1 for exposing the substrate supported by the second positioning module PW2 to a patterned beam of radiation. The first positioning module PW1 may be moved to the second positioning field FI2 to unload the substrate supported by the first positioning module PW1, load a new substrate on the first positioning module PW1 and to measure the upper surface of new the substrate by the measuring device.

In practice, usually a substrate will be loaded on a positioning module in the second positioning field FI2, where also the upper surface of the substrate is measured. Then, the positioning module is moved to the first positioning field FI1, where the substrate is exposed to a patterned beam of radiation. After exposure, the positioning module will be moved back to the second positioning field to unload the substrate from the positioning module.

In many applications, the time needed for processing of the substrate in the first positioning field FI1, i.e. exposure to a patterned radiation beam and associated tasks, requires more time than processing of the substrate in the second positioning field FI2, i.e. unloading/loading/level measurements and associated tasks. It is therefore desirable that the idle time required between processing of a substrate on the first positioning module PW1 and processing of a substrate on the second positioning module PW2 in the first positioning field FI1 is as short as possible, as this idle time is time critical for the cycle time of a substrate in the lithographic apparatus.

In this patent application it is proposed to decrease the idle time between subsequent processing of substrates in the first positioning field FI1. As a first feature it is proposed to move the second positioning module PW2 into the first positioning field PW1 before processing of the substrate supported on the first positioning module PW1 in the first positioning field is finished.

Figure 5:
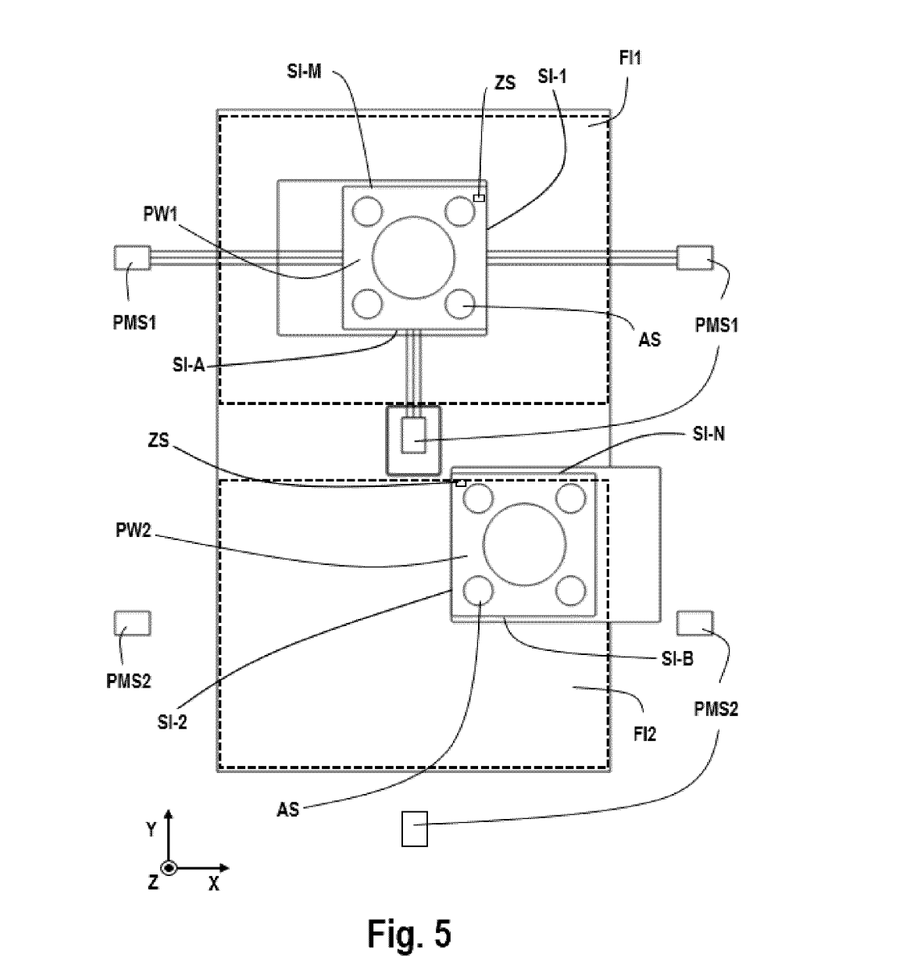

FIG. 5 shows the second positioning module PW2 in a first waiting position. The first positioning module PW1 is carrying out the first processing sequence (e.g. the substrate is exposed to a patterned beam of radiation). The first waiting position is in the second positioning field FI2 at a side of this second positioning field FI2 close to the first positioning field FI1. The second positioning module PW2 can be arranged in this first waiting position as soon as processing of the substrate supported on the second positioning module PW2 in the second positioning field FI2 is finished, while the second positioning module PW2 cannot yet safely be positioned in the first positioning field FI1. For example, the processing of the substrate supported on the first positioning module PW1 in the first positioning field FI1 may still require larger movements of the first positioning module PW1 in the first positioning field FI1 that prevent that the second positioning PW can be moved into the first positioning field FI1.

If there is space available in the first positioning field FI1 for the second positioning module PW2, for example during a final processing step in the first positioning field FI1 of the substrate supported on the first positioning module PW1, the second positioning module PW2 may be arranged in a second waiting position in the first positioning field FI1.

When space is available in the first positioning field FI1 directly after processing in the second positioning field FI2 of the substrate supported on the second positioning module PW2 is finished, the second positioning module PW2 can also directly be arranged in the second waiting position.

Figure 6:
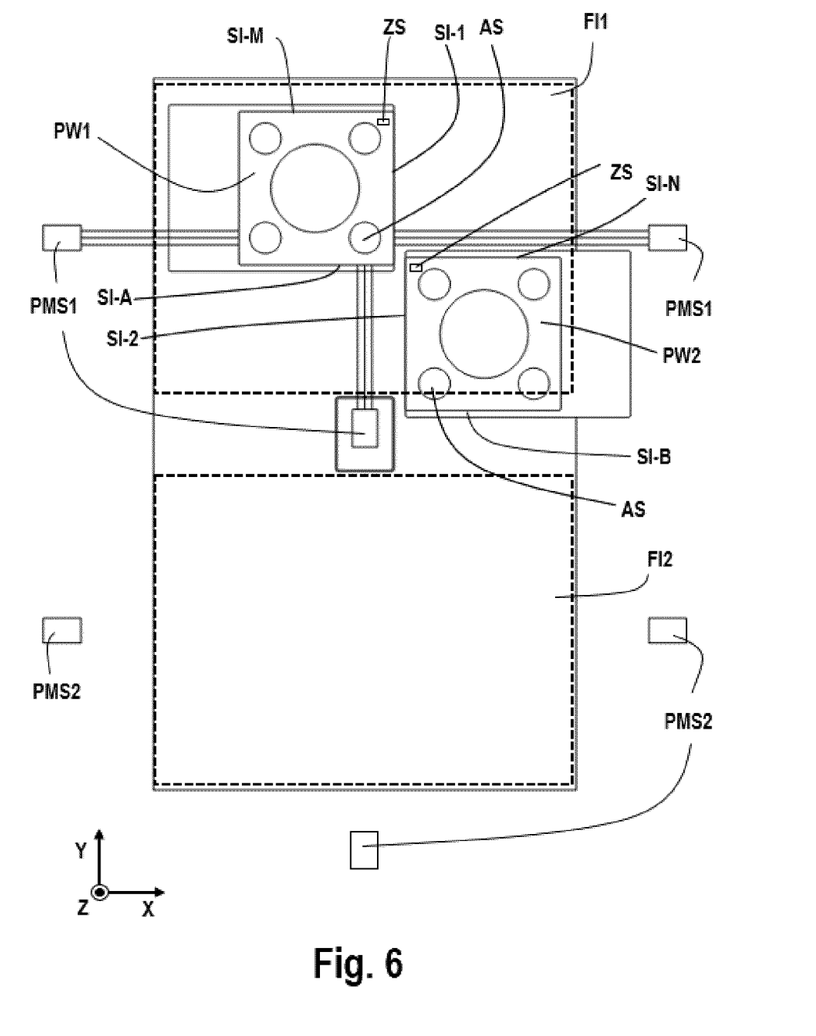

FIG. 6 shows the second positioning module PW2 arranged in the second waiting position in the first positioning field FI1 close to the first positioning module PW1, but without hindering position measurement of the first positioning module PW1. Since position measurement by the first position measurement system PMS1 is not hindered by the second positioning module PW2, processing of the first substrate supported on the first positioning module PW1 with one or more first processing devices can be continued even though the second positioning module PW2 is already arranged in the first positioning field FI1.

The final step of processing of the substrate in the first positioning field FI1 is a measurement using the aberration control measurement sensor AS. This aberration control measurement sensor AS, which is the final unit of processing in the first positioning field FI1, is arranged at a corner of the first positioning module PW1 of a side SI-A facing, in y-direction, towards the second positioning field FI2 and the first side SI-1 facing, in x-direction during a position swap, towards the second positioning module PW2. That is, the aberration control measurement sensor AS is positioned proximate the first side SI-1 of the first positioning module PW1.

By arranging the final unit of processing in the first positioning field FI1 at this corner additional space is created for arranging the second positioning module PW2 in the first positioning field FI1, while processing of a substrate on the first positioning module PW1 in the first positioning field FI1 has not yet been finished. Correspondingly, the final unit, for example an aberration control measurement sensor AS of the second positioning module PW2 is arranged at a corner of a side SI-B facing, in y-direction, towards the second positioning field FI2 and the second side SI-2 facing, in x-direction during a position swap, towards the first positioning module PW1. That is, the aberration control measurement sensor AS is positioned proximate the second side SI-2 of the second positioning module PW2. This creates space for positioning the first positioning module PW1 in the first positioning field FI1, while processing of a substrate on the second positioning module PW2 in the first positioning field FI1 has not yet been finished.

When the first positioning module PW1 is finishing or has finished the first processing sequence, a distance between the two positioning modules is less than 20 cm, preferably less than 10 cm, more preferably less than 5 cm. The distance is defined as the shortest distance between a part of the first positioning module PW1 and the second positioning module PW2. The shorter the distance, the less time it is needed to move the second positioning module PW2 to the position to carry out the first processing sequence. On the other hand, the distance cannot be so small that position measurement by the first position measurement system PMS1 is hindered by the second positioning module PW2.

The first step of processing of the substrate supported by the second positioning module PW2 in the first positioning field FI1 is a measurement of the zeroing location ZS on the second positioning module PW2 using a zeroing sensor. This zeroing location ZS, which is the first unit of processing, is arranged at a corner of the second positioning module PW2 of a side SI-M facing, in y-direction, away from the second positioning field FI2 and the first side SI-1 facing, in x-direction during a position swap, towards the first positioning module PW1.

By arranging the first unit of processing in the first positioning field FI1 at this corner the distance between the second waiting position of the second positioning module PW2 and a first processing position of the second positioning module PW2 for processing in the first positioning field FI1 using the zeroing location ZS is made relatively small, which further decreases the idle time of the processing of substrates in the first positioning field Hi.

Correspondingly, the first unit of processing in the first positioning field, i.e. the zeroing location ZS, of the second positioning module PW2 is arranged at a corner of a side SI-N facing, in y-direction, away from the second positioning field FI2 and the second side SI-2 facing, in x-direction during a position swap, towards the first positioning module PW1.

Since the sensor configurations on the first positioning module PW1 and the second positioning module PW2 are arranged to lower the idle time of processing in the first positioning field FI1, the sensor units of the first positioning module PW1 and the second positioning module PW2 are mirrored with respect to a mirror plane extending in the y-direction and a z-direction perpendicular to the x-y-plane, whereby the first unit and final unit are arranged at the side SI-1, SI-2 of the positioning module PW1, PW2 facing towards the side SI-2, SI-1 of the other positioning module PW2, PW1 when passing each other in y-direction during a position swap.

The first positioning module PW1 and the second positioning module PW2 each comprise a long-stroke module and a short-stroke module, wherein the long-stroke module supports the short-stroke module and the short-stroke module is arranged to support the substrate. The short-stroke module is arranged to move the substrate relative to the long-stroke module with a high accuracy over a small range of movement, and the long-stroke module is arranged to move the short-stroke module with a relatively low accuracy over a large range of movement.

By arranging the short-stroke module of the first positioning module PW1 at or near the end of the large range of movement of the long stroke in x-direction closest to the second positioning module PW2 (E.g. in FIG. 6 at or near the end of the large stroke in positive x-direction) and the short-stroke module of the second positioning module at or near the end of the large range of movement of the long stroke in x-direction closest to the first positioning module PW1 (E.g. in FIG. 6 at or near the end of the large stroke in negative x-direction), also more space is created to arrange the second positioning module PW2 in the second waiting position close to the first positioning module PW1. This may further decrease the idle time in the processing of the substrate in the first positioning field FI1. The side of the short-stroke module of the first positioning module PW1 which side is further in the x-direction (i.e. the positive x-direction side of the short-stroke module of PW1) is positioned in the x-direction as much as possible towards the side of the long-stroke module of the first positioning module PW1 which side is further in the x-direction (i.e. the positive x-direction side of the long-stroke module of PW1) such that the short-stroke module and the long-stroke module of PW1 are aligned or almost aligned. Similarly, the side of the short-stroke module of the second positioning module PW2 which side is further in the negative x-direction (i.e. the negative x-direction side of the short-stroke module of PW2) is positioned in the x-direction as much as possible towards the side of the long-stroke module of the second positioning module PW2 which side is further in the negative x-direction (i.e. the negative x-direction side of the long-stroke module of PW2) such that the short-stroke module and the long-stroke module of PW2 are aligned or almost aligned.

As soon as processing of the substrate on the first positioning module PW1 is finished, the first positioning module PW1 may be moved towards the second positioning field FI2 and the second positioning module PW2 may be positioned in a zeroing position to enable zeroing measurements.

Figure 7:
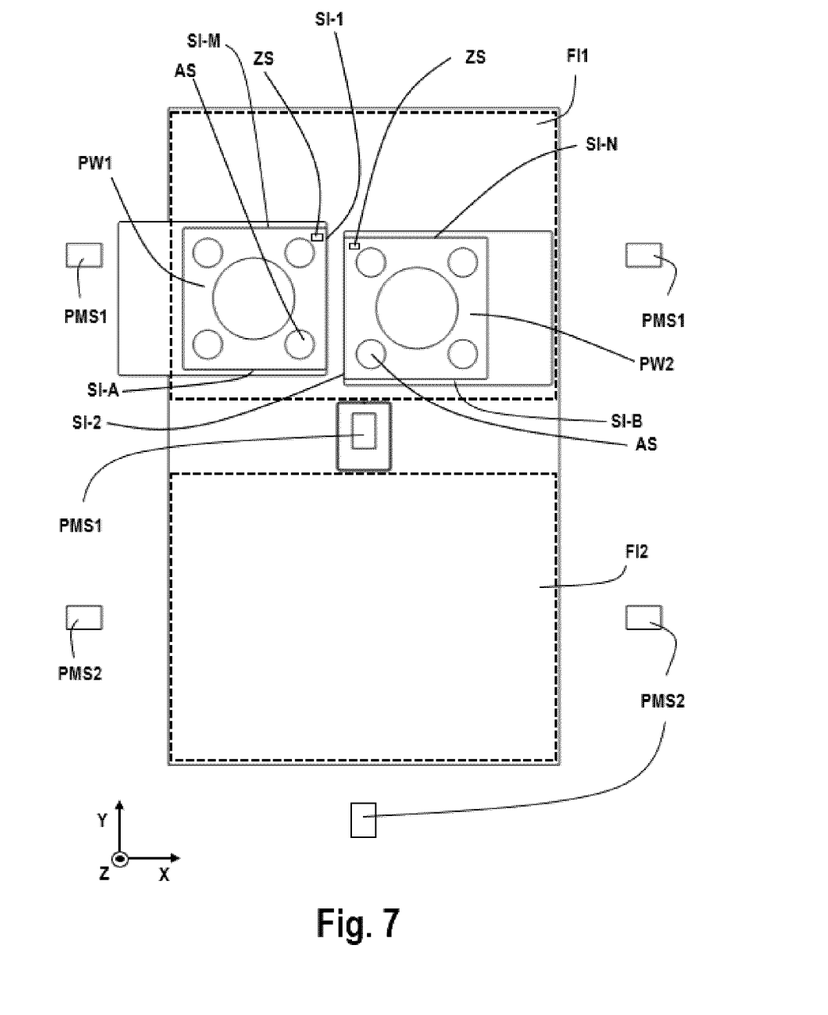

FIG. 7 shows positions of the first positioning module PW1 and the second positioning module PW2 wherein the first positioning module PW1 is moving towards the second positioning field FI2 and the second positioning module PW2 is already in a zeroing position to carry out zeroing measurements. In these positions, the position of the first positioning module PW1 prevents that the position of the second positioning module PW2 can be determined using the first position measurement system PMS1. Since in conventional zeroing measurements, position of the second positioning module PW2 as measured by the first position measurement system PMS1 is needed, conventional zeroing measurements cannot be started as long as the first positioning module PW1 prevents position measurement of the second positioning module PW2.

According to an embodiment of the invention, it is proposed to start zeroing measurements without position measurement of the first position measurement system PMS1 being available. It has been found that the zeroing measurements can already be started using a position determined on the basis of the zeroing measurements. This means that as soon as the zeroing sensor is aligned with the zeroing location ZS on the second positioning module PW2, zeroing measurements can be started. These measurements enable to determine the position of the second positioning module PW2 with respect to the zeroing sensor with a certain accuracy. On the basis of the determined position, the position of the second positioning module PW2 may be adjusted to an improved position for the zeroing measurements.

Figure 8:
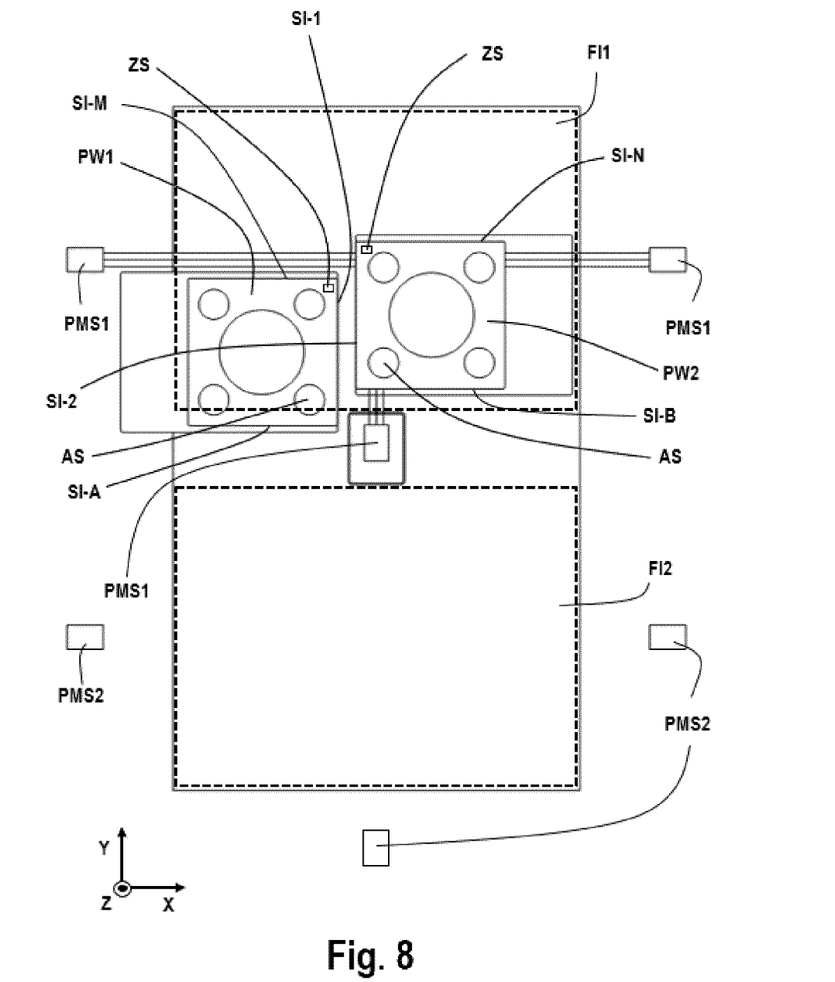

FIG. 8 shows that the first positioning module PW1 has moved further towards the second positioning field FI2. The first positioning module PW1 no longer prevents that the position of the second positioning module PW2 can be measured by the first position measurement system PMS1. As soon as the position of the second positioning module PW2 can be measured, the measured position can be taken into account in the zeroing measurements carried out by the zeroing sensor on the zeroing location ZS.

The second positioning module PW2 will remain in the first positioning field FI1 for further processing of the substrate supported by the second positioning module PW2 with the processing devices associated with the first positioning field FI1.

At the same time, the first positioning module PW1 is moved to the second positioning field FI2, where the processed substrate will be unloaded and a substrate to be processed will be loaded on the first positioning module PW1. Thereafter the upper surface of the substrate now supported by the first positioning module PW1 is measured by the level sensor. Also other tasks associated with the second positioning field FI2 may be carried out with respect to the substrate loaded on the first positioning module PW1.

Compared with FIG. 4, the positions of the first positioning module PW1 and the second positioning module PW2 are now swapped. Since the unloading/loading of the substrate and measurement by the level sensor will normally consume less time than the processing of the substrate in the first positioning field FI1, processing of the substrate on the first positioning module PW1 will now be finished before processing of the substrate on the second positioning module PW2.

Therefore, after processing of the substrate on the first positioning module PW1, the first positioning module PW1 can be brought to a first waiting position in the second positioning field FI2 as long as no place is available in the first positioning field. When space is available in the first positioning field FI, for example when the substrate supported on the second positioning module PW2 is in the final processing step of the first positioning field FI1, the first positioning module PW1 may be positioned in a second waiting position in the first positioning field FI1 close to the second positioning module PW2, but without hindering position measurement of the second positioning module PW2 by the first position measurement system PMS. This second waiting position of the first positioning module PW1 is approximately the position of the first positioning module shown in FIG. 8. When processing of the substrate supported by the second positioning module is finished, substantially the same position swap of the first positioning module PW1 and the second positioning module PW2 as described above can be made but mirrored in a y-z plane.

In this position swap, all the features that decrease the idle time of the processing of the substrate W in the first positioning field FI1 can be applied.

In the embodiment described with respect to FIGS. 4 to 8 the processing of substrates in the first positioning field FI1 was regarded to be time critical. Therefore, the position swap of the first positioning module PW1 and the second positioning module PW2 was carried out in the first positioning field FI1 to minimize idle time in the processing of substrates in the first positioning field FI1. Correspondingly, the position swap of the first positioning module PW1 and the second positioning module PW2 may also be carried out in the second positioning field FI2 to minimize idle time in the processing of substrates in the second positioning field FI2 when processing in the second positioning field FI2 is time critical.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clauses

1. A positioning device, comprising:
a first positioning module (PW1) arranged to support and position a first substrate,
a second positioning module (PW2) arranged to support and position a second substrate,
a first positioning field (FI1) in which the first positioning module and the second positioning module can be positioned to cooperate with one or more first processing devices,
a second positioning field (FI2) in which the first positioning module and the second positioning module can be positioned to cooperate with one or more second processing devices,
wherein the first positioning field and the second positioning field extend in a positioning plane extending in a first direction and a second direction perpendicular to the first direction,
wherein the first positioning field and the second positioning field are arranged adjacent to each other in the first direction, and wherein the first positioning module and the second positioning module can swap position in the first direction, wherein, during a position swap, a first side of the first positioning module faces in the second direction a second side of the second positioning module,
wherein the first positioning module and the second positioning module each comprise a first unit to carry out a first processing step in the first positioning field and a final unit to carry out a final processing step in the first positioning field, wherein the first unit and the final unit are arranged at the first side of the first positioning module and at the second side of the second positioning module, respectively.

2. The positioning device of clause 1, wherein the final unit of the first positioning module is arranged near a first corner of the first side and a side of the first positioning module facing, when positioned in the first positioning field, towards the second positioning field, and wherein the final unit of the second positioning module is arranged near a second corner of the second side and a side of the second positioning module facing, when positioned in the first positioning field, towards the second positioning field.

3. The positioning device of clause 1 or 2, wherein the first unit of the first positioning module is arranged near a second corner of the first side and a side of the first positioning module facing, when positioned in the first positioning field, away from the second positioning field and the first unit of the second positioning module is arranged near a second corner of the second side and a side of the second positioning module facing, when positioned in the first positioning field, away from the second positioning field.

4. The positioning device of any of the preceding clauses, wherein the first unit is a zeroing location arranged to cooperate with a zeroing sensor.

5. The positioning device of clause 4, wherein the zeroing sensor is arranged to carry out zeroing measurements, before a position of the respective first or second positioning module is determined by a position measurement system.

6. The positioning device of any of the preceding clauses, wherein the final unit is an aberration control measurement sensor or/and wherein the first positioning field is an expose field of the positioning device and wherein the second positioning field is a measure field of the positioning device.

7. The positioning device of any of the preceding clauses, wherein the first positioning module and the second positioning module each comprise a set of sensors, wherein a first configuration of the set of sensors of the first positioning module and a second configuration of the set of sensors of the second positioning module are mirrored with respect to a mirror plane extending in the first direction and a direction perpendicular to the positioning plane.

8. The positioning device of any of the preceding clauses, wherein the first positioning module and the second positioning module each comprise a long-stroke module and a short-stroke module, wherein the long-stroke module supports the short-stroke module and the short-stroke module is arranged to support a substrate, wherein the short-stroke module is arranged to move the substrate relative to the long-stroke module with a higher accuracy over a smaller range of movement, and wherein the long-stroke module is arranged to move the short-stroke module with a relatively low accuracy over a large range of movement in the second direction, wherein a control device of the positioning device is arranged to position the short-stroke module of the first positioning module at or near an end of the large range of movement of the long stroke module in the second direction closest to the second positioning module and the short-stroke module of the second positioning module near an end of the large range of movement of the long stroke module in the second direction closest to the first positioning module.

9. The positioning device of any of the preceding clauses, wherein a control device of the positioning device is configured to arrange, during processing of the first substrate supported on the first positioning module with the one or more first processing devices, the second positioning module at least partially in the first positioning field without hindering position measurement of the first positioning module and/or to arrange, during processing of the second substrate supported on the second positioning module with the one or more first processing devices, the first positioning module at least partially in the first positioning field without hindering position measurement of the second positioning module.

10. The positioning device of any of the preceding clauses, wherein the positioning device comprises a first position measurement system to determine a position of the first positioning module or second positioning module in the first positioning field and a second position measurement system to determine a position of the first positioning module or second positioning module in the second positioning field.

11. A method of using a positioning device, the positioning device, comprising:

a first positioning module arranged to support and position a first substrate, a second positioning module arranged to support and position a second substrate, a first positioning field in which the first positioning module and the second positioning module can be positioned to cooperate with the one or more first processing devices, a second positioning field in which the first positioning module and the second positioning module can be positioned to cooperate with one or more second processing devices, wherein the first positioning field and the second positioning field extend in a positioning plane extending in a first direction and second direction perpendicular to the first direction, wherein the first positioning field and the second positioning field are arranged next to each other in the first direction, and wherein the first positioning module and the second positioning module can swap position in the first direction, wherein, during a position swap, a first side of the first positioning module faces a second side of the second positioning module in the second direction, wherein the method comprises the step of carrying out a position swap of the first positioning module and the second positioning module, wherein the first positioning module is moved from the first positioning field to the second positioning field and the second positioning module is moved from the second positioning field to the first positioning field, comprising the steps of:

during processing of the first substrate supported on the first positioning module with one or more first processing devices, arranging the second positioning module at least partially in the first positioning field without hindering position measurement of the first positioning module, and when processing of the first substrate supported on the first positioning module with the one or more first processing devices is finished, moving the first positioning module towards the second positioning field and moving the second positioning module to a position to cooperate with the one or more first processing devices, and processing of the second substrate on the second positioning module with the one or more first processing devices.
12. The method of clause 11, wherein the first step of processing of the second substrate comprises carrying out zeroing measurements before a position of the second positioning module is determined by a position measurement system.
13. The method of clause 11 or 12, wherein the first positioning module and the second positioning module each comprise a first unit to carry out a first processing step in the first positioning field and a final unit to carry out a final processing step in the first positioning field, wherein the first unit and the final unit are arranged at the first side of the first positioning module and at the second side of the second positioning module.
14. The method of any clauses 11-13, wherein the method comprises the step of carrying out a position swap of the second positioning module and the first positioning module, wherein the second positioning module is moved from the first positioning field to the second positioning field and the first positioning module is moved from the second positioning field to the first positioning field, comprising the steps of:
during processing of the second substrate supported on the second positioning module with one or more first processing devices, arranging the first positioning module at least partially in the first positioning field without hindering position measurement of the second positioning module, and
when processing of the second substrate supported on the second positioning module with the one or more first processing devices is finished, moving the second positioning module towards the second positioning field and moving the first positioning module to a position to cooperate with the one or more first processing devices, and processing of a new first substrate on the first positioning module with the one or more first processing devices.
15. A lithographic apparatus comprising the positioning device of any of the clauses 1-10.
16. A method of using a positioning device, the positioning device, comprising:
a first positioning module arranged to support and position a first substrate,
a second positioning module arranged to support and position a second substrate,
a first positioning field (FI1) in which the two positioning modules can be alternatingly positioned to carry out a first processing sequence,
a second positioning field (FI2) in which the two positioning modules can be alternatingly positioned to carry out a second processing sequence,
wherein when one of the two positioning modules is carrying out or finishing the first processing sequence, the other positioning module has finished the second processing sequence and is positioned closer to the one of the two positioning modules.
17. The method of clause 16, comprising the step of carrying out a position swap of the first positioning module and the second positioning module, wherein the first positioning module is moved from the first positioning field to the second positioning field and the second positioning module is moved from the second positioning field to the first positioning field, comprising the steps of:
during the first positioning module carrying out or finishing the first processing sequence, arranging the second positioning module at least partially in the first positioning field without hindering position measurement of the first positioning module, and
when the first processing sequence is finished, moving the first positioning module towards the second positioning field and moving the second positioning module to a position for carrying out the first processing sequence.
18. The method of clause 17, wherein a first step of the first processing sequence for second positioning module comprises carrying out zeroing measurements before a position of the second positioning module is determined by a position measurement system.
19. The method of clause 17 or 18, wherein the first positioning module and the second positioning module each comprise a final unit to carry out a final processing step in the first positioning field,
wherein the first positioning field and the second positioning field are arranged adjacent to each other in a first direction (y-axis),
the first positioning module is arranged to swap position with the second positioning module in the first direction while a first side of the first positioning module faces in a second direction (x-axis) a second side of the second positioning field;
wherein the first positioning module and the second positioning module each comprise a final unit configured to carry out a final step of one of the first processing sequence and the second processing sequence;
wherein the final unit of the first positioning module is arranged proximate the first side and the final unit of the second positioning module is arranged proximate the second side.
20. The method of any of clauses 17-19, wherein the method further comprises the step of carrying out a position swap of the second positioning module and the first positioning module, wherein the second positioning module is moved from the first positioning field to the second positioning field and the first positioning module is moved from the second positioning field to the first positioning field, comprising the steps of:
during the second positioning module carrying out or finishing the first processing sequence, arranging the first positioning module at least partially in the first positioning field without hindering position measurement of the second positioning module, and
when the first processing sequence is finished, moving the second positioning module towards the first positioning field and moving the first positioning module to a position for carrying out the first processing sequence.

The invention claimed is:
1. A positioning device, comprising:
a first positioning module arranged to support and position a first substrate,
a second positioning module arranged to support and position a second substrate,
a first positioning field in which the first and second positioning modules can be alternatingly positioned to carry out a first processing sequence, the first positioning field configured to allow position measurement of the first or second positioning module when respectively in the first positioning field and to allow zeroing measurement of the first or second positioning module when respectively in the first positioning field,
a second positioning field in which the first and second positioning modules can be alternatingly positioned to carry out a second processing sequence,
wherein when one of the first and second positioning modules is carrying out or finishing the first processing sequence, the other of the first and second positioning modules has finished the second processing sequence and is positioned closer to the one of the first and second positioning modules than in a position where the second processing sequence takes place, and
wherein the other positioning module is configured to be able to carry out the zeroing measurement of the other positioning module without the position measurement of the other positioning module being available in the first positioning field.

2. The positioning device of claim 1, wherein the first and second positioning modules are configured to carry out the first and second processing sequences alternatingly, or/and
wherein when one of the first and second positioning modules is carrying out or finishing the first processing sequence, arranging the other positioning module at least partially in the first positioning field without hindering position measurement of the one of the first and second positioning modules.

3. The positioning device of claim 1, wherein when one of the first and second positioning modules is finishing or has finished the first processing sequence, a distance between the first and second positioning modules is less than 20 cm.

4. The positioning device of claim 1, wherein the first positioning field and the second positioning field are arranged adjacent to each other in a first direction (y-axis);
wherein the first positioning module is arranged to swap position with the second positioning module in the first direction while a first side of the first positioning module faces, in a second direction (x-axis), a second side of the second positioning module;
wherein the first positioning module and the second positioning module each comprise a final unit configured to carry out a final step of the first processing sequence or the second processing sequence;
wherein the final unit of the first positioning module is arranged proximate the first side and the final unit of the second positioning module is arranged proximate the second side.

5. The positioning device of claim 4, wherein the second direction is perpendicular to the first direction or/and the final step is of the first processing sequence.

6. The positioning device of claim 4, wherein the final unit of the first positioning module is arranged near a first corner of the first side and a side of the first positioning module facing, when positioned in the first positioning field, towards the second positioning field, and
wherein the final unit of the second positioning module is arranged near a first corner of the second side and a side of the second positioning module facing, when positioned in the first positioning field, towards the second positioning field.

7. The positioning device of claim 1, wherein the first positioning module and the second positioning module each comprise a first unit to carry out a first processing step of the first processing sequence, wherein the first unit is a zeroing location arranged to cooperate with a zeroing sensor.

8. The positioning device of claim 7, wherein the zeroing sensor is arranged to carry out zeroing measurements, before a position of the respective first or second positioning module is determined by a position measurement system.

9. The positioning device of claim 4, wherein the final unit is an aberration control measurement sensor or/and wherein the first positioning field is an expose field of the positioning device and the second positioning field is a measure field of the positioning device.

10. The positioning device of claim 1, wherein the first positioning field and the second positioning field extend in a positioning plane in a first direction and a second direction;
wherein the first positioning module and the second positioning module each comprise a set of sensors, wherein a first configuration of the set of sensors of the first positioning module and a second configuration of the set of sensors of the second positioning module are mirrored with respect to a mirror plane extending in the first direction and a direction perpendicular to the positioning plane.

11. The positioning device of claim 1, wherein the first positioning module and the second positioning module each comprise a long-stroke module and a short-stroke module, wherein the long-stroke module supports the short-stroke module and the short-stroke module is arranged to support a substrate, wherein the short-stroke module is arranged to move the substrate relative to the long-stroke module with a higher accuracy over a smaller range of movement, and wherein the long-stroke module is arranged to move the short-stroke module with a relatively low accuracy over a large range of movement in a direction,
wherein a control device of the positioning device is arranged to position the short-stroke module of the first positioning module at or near an end of the large range of movement of the long stroke module in the direction closest to the second positioning module and position the short-stroke module of the second positioning module near an end of the large range of movement of the long stroke module in the direction closest to the first positioning module.

12. The positioning device of claim 1, wherein a control device of the positioning device is configured to arrange, during processing of the first substrate supported on the first positioning module with the one or more first processing devices, the second positioning module at least partially in the first positioning field without hindering position measurement of the first positioning module and/or to arrange, during processing of the second substrate supported on the second positioning module with the one or more first processing devices, the first positioning module at least partially in the first positioning field without hindering position measurement of the second positioning module.

13. The positioning device of claim 1, wherein the positioning device comprises a first position measurement system to determine a position of the first positioning module or second positioning module in the first positioning field and a second position measurement system to determine a position of the first positioning module or second positioning module in the second positioning field.

14. A positioning device, comprising:
a first positioning module arranged to support and position a first substrate,
a second positioning module arranged to support and position a second substrate, wherein the first positioning module is arranged to swap position with the second positioning module in a first direction while a first side of the first positioning module faces, in a second direction, a second side of the second positioning module, wherein the first positioning module and the second positioning module each comprise a final unit to carry out a final processing step that is other than position measurement of the respective first or second positioning module using an encoder or interferometer, wherein the final unit of the first positioning module is arranged proximate the first side and the final unit of the second positioning module is arranged proximate the second side.

15. A lithographic apparatus comprising the positioning device of claim 14.

16. The positioning device of claim 14, wherein the second direction is perpendicular to the first direction or/and the final step is of the first processing sequence.

17. The positioning device of claim 14, wherein the final unit of the first positioning module is arranged near a first corner of the first side and a side of the first positioning module facing, when positioned in the first positioning field, towards the second positioning field, and wherein the final unit of the second positioning module is arranged near a first corner of the second side and a side of the second positioning module facing, when positioned in the first positioning field, towards the second positioning field.

18. The positioning device of claim 14, wherein the final unit is an aberration control measurement sensor or/and wherein the first positioning field is an expose field of the positioning device and the second positioning field is a measure field of the positioning device.

19. The positioning device of claim 14, wherein the first positioning field and the second positioning field extend in a positioning plane in a first direction and a second direction;

wherein the first positioning module and the second positioning module each comprise a set of sensors, wherein a first configuration of the set of sensors of the first positioning module and a second configuration of the set of sensors of the second positioning module are mirrored with respect to a mirror plane extending in the first direction and a direction perpendicular to the positioning plane.

20. A lithographic apparatus comprising the positioning device of claim 1.

* * * * *